United States Patent [19]

Schmidt et al.

[11] 4,132,763

[45] Jan. 2, 1979

[54] PROCESS FOR THE PRODUCTION OF PURE, SILICON ELEMENTAL SEMICONDUCTOR MATERIAL

[75] Inventors: Dietrich Schmidt, Burghausen; Johann Hofer, Kirchdorf, both of Fed. Rep. of Germany; Karl E. Huber, Ach, Austria

[73] Assignee: Wacker-Chemie GmbH, Munich, Fed. Rep. of Germany

[21] Appl. No.: 811,029

[22] Filed: Jun. 29, 1977

[30] Foreign Application Priority Data

Aug. 12, 1976 [DE] Fed. Rep. of Germany ....... 2636348

[51] Int. Cl.$^2$ .................................................. C01B 33/02
[52] U.S. Cl. ...................................... 423/350; 423/349
[58] Field of Search ................................ 423/349, 350

[56] References Cited

U.S. PATENT DOCUMENTS

| 2,938,772 | 5/1960 | Enk | 423/349 |
| 4,054,641 | 10/1977 | Carman | 423/349 X |

FOREIGN PATENT DOCUMENTS

| 546346 | 9/1957 | Canada | 423/349 |
| 615899 | 3/1961 | Canada | 423/349 |
| 1097964 | 1/1961 | Fed. Rep. of Germany | 423/349 |
| 1151782 | 7/1963 | Fed. Rep. of Germany | 423/349 |
| 1167320 | 4/1964 | Fed. Rep. of Germany | 423/350 |
| 1180353 | 10/1964 | Fed. Rep. of Germany | 423/349 |

*Primary Examiner*—Jack Cooper
*Attorney, Agent, or Firm*—Allison C. Collard; Thomas M. Galgano

[57] ABSTRACT

An improved process for the production of pure, elemental semiconductor material, especially silicon, of the type wherein the semiconductor material is produced by decomposition from the gaseous phase, is provided, which includes the initial step of maintaining a melt of the semiconductor material at a temperature of up to a maximum of 200° C above the melting point of the material. Thereafter, at least a gaseous, decomposable compound of the semiconductor material is introduced into the melt, under a pressure of about 0.01 to 30 bar, to produce a pure, elemental semiconductor material in liquid form.

4 Claims, 1 Drawing Figure

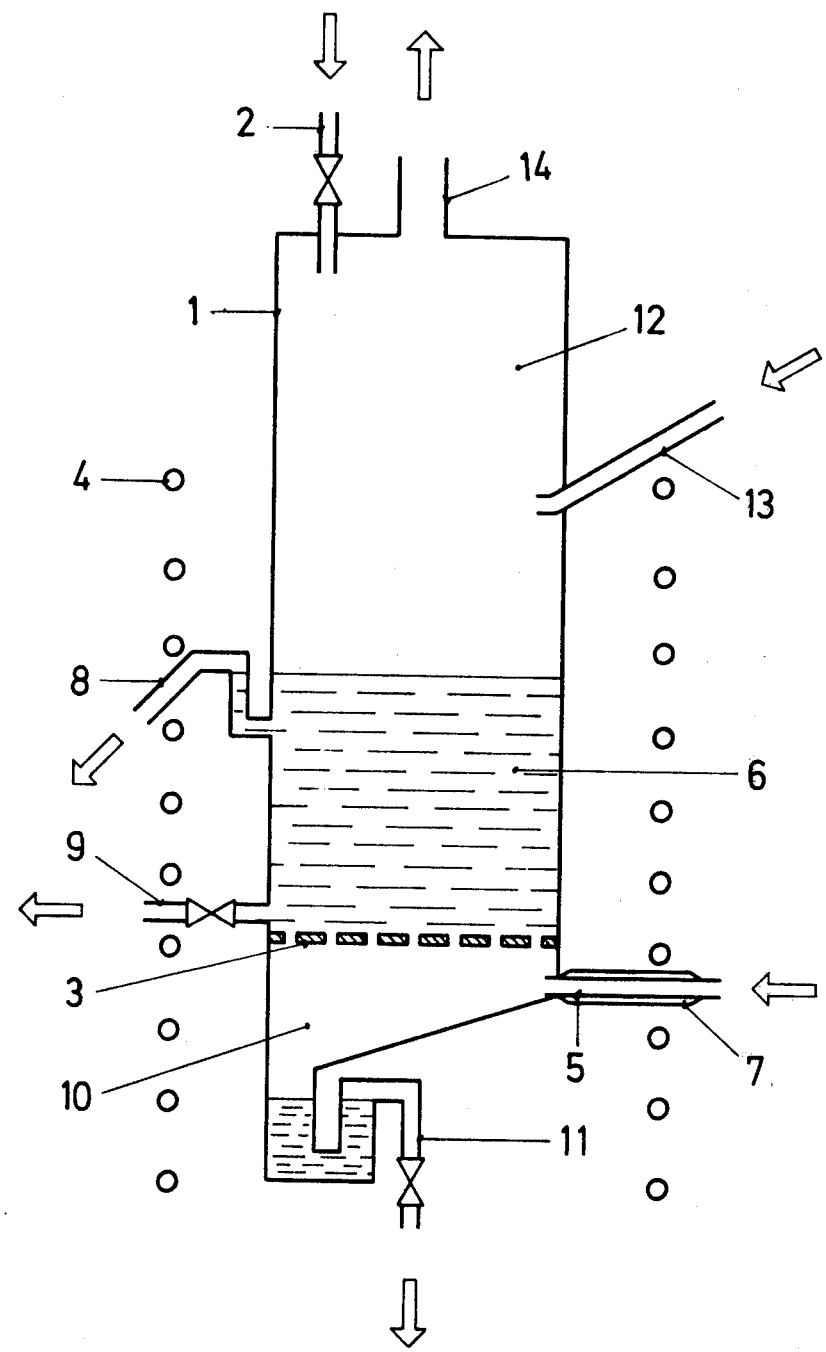

PROCESS FOR THE PRODUCTION OF PURE, SILICON ELEMENTAL SEMICONDUCTOR MATERIAL

The invention relates to a process for the production of pure, elemental semiconductor material. More particularly, it relates to such a process for the production of silicon, by deposition from the gaseous phase.

Pure, elemental silicon is generally produced by deposition from its gaseous, decomposable hydrogen or halogen compounds, normally in admixture with hydrogen, on filaments or thin rods heated to deposition temperature. The polycrystalline silicon rods obtained are subsequently converted into monocrystalline material, generally by crucible-free zone melting, or, in comminuted form, serve as starting material for crucible pulling processes or casting processes. A decisive disadvantage of this process is that the deposition, especially in the initial stages, progresses slowly, and therefore uneconomically, on account of the small deposition surface.

Polycrystalline silicon for crucible pulling processes or casting processes can, on the other hand, be produced more economically by deposition from the gaseous phase in a fluidized bed reactor. In this process, silicon deposits on small silicon particles of a predetermined size, which, after reaching a certain weight, fall out of the fluidized bed and are removed as silicon granules. After melting, this material can then, for example, be cast to form shaped silicon bodies.

For the last-mentioned purpose, however, a process which yields molten silicon directly as its reaction product is more suitable, since it enables the energy required for the melting to be saved.

Such a process is described in German Offenlegungsschrift No. 25 33 455. In the process, silicon is deposited from gaseous, decomposable compounds onto super-heated quartz rods, over which it downwardly flows. It can then be taken in molten form directly out of the reactor. The decisive disadvantage of this process, however, lies in the short life of the deposition rods. The quartz rods, in fact, react at the high temperatures with the silicon to form volatile silicon monoxide, as a result of which they literally volatilize within a short time.

The task on which the invention is based therefore, is to discover an economic process for the production of pure, elemental semiconductor material, such as silicon in particular, which does not have the disadvantages of known processes and in which the semiconductor material is yielded directly in liquid form.

This problem is solved by a process, according to the invention, which is characterized in that one or more gaseous, decomposable compounds of the relevant semiconductor material are introduced under a pressure of 0.01 to 30 bar into a melt of the relevant semiconductor material kept at a temperature of up to a maximum of 200° C. above the melting point.

Silicon hydride, monochlorosilane, dichlorosilane, trichlorosilane, tetrachlorosilane and hexachlorodisilane may, for example, be used as gaseous, decomposable compounds, alone or in admixture, if appropriate with the addition of hydrogen or inert gases such as, for example, argon or helium, although trichlorosilane and trichlorosilane in admixture with hydrogen are preferred.

The process will be described in greater detail with reference to the drawing, which shows schematically a reactor suitable for carrying out the process.

As is schematically illustrated in the drawing, a reactor 1 is charged with silicon granules by way of a filling nozzle 2. The reactor 1 may, for example, consist of a quartz tube substantially surrounded by a form-closed carbon body, of or silicon nitride or, preferably, of glass carbon having a glow temperature of more than 1,500° C. Glass carbon is a glass-like carbon of high glow temperature produced by carbonizing a spatially, cross-linked synthetic resin. The sieve plate 3, on which the silicon granules lie, may be, for example, a quartz frit or preferably a sieve floor made of glass carbon, having a glow temperature of more than 1,500° C. The width of the pores in sieve plate 3 is relatively unimportant, owing to the high surface tension of liquid silicon and is, to a certain extent, dependent on the flow velocity of the deposition gas passing through. Normally, operation will be carried out with pore width of the order of 0.2 to 2 mm, although larger and smaller values also, depending on the type and size of the plant, may still be quite as advantageous.

The granulated silicon which has been introduced, is then melted by means of a suitable heating device 4, for example, a resistance furnace, and kept at a temperature of from 1,410° to 1,610° C., preferably 1,420° to 1,470° C., during the deposition. In addition to external heating device 4, it is naturally likewise possible to work with a heating finger, or a high frequency heating device.

Through an open jet nozzle 5, arranged below the sieve plate 3, the deposition gas is introduced by blowing through sieve plate 3 into liquid silicon 6. The temperature of the deposition gas which has been introduced, for example, trichlorosilane, is preferably about room temperature, although the deposition gas may also be introduced preheated to a temperature of at most about 500° C. The decisive factor in this case is that the particular deposition gas used is kept at a temperature below its decomposition temperature, in order to prevent nozzle 5 from becoming blocked. Heat insulation 7, insulating open jet nozzle 5 from heating device 4, also serves this purpose. The pressure under which the deposition gas is introduced is in the range of about 0.01 to 30 bar, and must always be higher than the sum of the hydrostatic pressure of the melt and the gas pressure established above the melt.

The deposition gas passes in many small, gas bubbles through silicon melt 6 and, in so doing, reacts with decomposition, to form liquid silicon. The level of liquid can be held constant by way of an over-flow siphon 8, through which the amount of silicon produced flows away continuously. Another possibility is to force liquid silicon batchwise through overflow 8 out of reactor 1, by the effect of a gas pressure on the surface of the silicon, for example, by damming up the waste gas. On the other hand, the amount of molten silicon required in each case can be removed from reactor 1 as required by way of outlet nozzle 9, provided with a suitable closure device, for example, a stop-cock. Outlet nozzle 9 serves, in particular, to allow the entire silicon melt 6 to be discharged when reactor 1 is shut down.

Space 10 beneath sieve plate 3 is advantageously likewise equipped with an over-flow siphon 11, which is provided with a suitable safety-cock, for example, a valve, a stop-cock or a gas counter-pressure arrangement, in order to be able to let off liquid silicon, which is formed by reaction of the deposition gas caused by hot sieve plate 3, as required or, if desired, alternatively, continuously. Into space 12 above silicon melt 6, a cooling gas, for example, hydrogen, helium or argon, is introduced by blowing it through the gas nozzle 13 at a temperature of about 20° to 50° C., to cool the reaction gases emerging from the melt, which naturally still contains undecomposed gaseous silicon compounds, to a temperature below the deposition temperature. As a result of this, the upper space 12 in the reactor and its feed pipes are effectively prevented from becoming caked up. The waste gas (i.e., the gas mixture emerging from the melt), then leaves reactor 1 by way of waste gas nozzle 14, together with the cooling gas. The silicon compounds can be condensed out of the waste gas again and re-introduced by way of the open jet nozzle 5 into reactor 1.

The reactor described as an example may in principle also be altered such that several sieve plates with silicon melts above them and intermediate gas spaces are arranged one above the other, in order to decompose quantitatively waste gas that has not been consumed.

The molten silicon obtained can be used directly for subsequent casting processes, for example, for the manufacture of shaped articles, plates, bars or rods. In its simplicity and economy, the process is superior to all processes mentioned at the beginning as belonging to the state of the art. The process is also not limited to silicon, but can also be used in an analogous manner, especially for the production of pure, elemental germanium.

EXAMPLE

In a reactor made of glass carbon having a glow temperature of more than 2,500° C. ("Sigradur D")and a diameter of 60 mm, granulated silicon is melted under argon. The depth of the liquid layer is 50 mm, and the temperature of the silicon is set to 1,430° C. As deposition gas, a mixture of trichlorosilane and hydrogen in a molar ratio of 1:1 is introduced under a pressure of about 1.6 bar in an amount of 200 normal liters per hour. At the same time, 1,000 normal liters per hour of argon at room temperature, that is, at about 25° C., is introduced as cooling gas into the space above the surface of the melt. The pressure in the space above the silicon melt is 1.5 bar.

0.20 g of pure silicon per liters of trichlorosilane gas is deposited; the deposition rate is accordingly, 20 g/h.

While only a single embodiment of the present invention has been shown and described, it will be obvious to those persons of ordinary skill in the art, that many changes and modifications may be made thereunto, without departing from the spirit and scope of the invention.

What is claimed is:

1. A process for the production of pure elemental silicon, comprising the steps of:

maintaining a melt of silicon at a temperature at least equal to and up to a maximum of 200° C. above the melting point of silicon on a gas-permeable sieve floor of a reactor;

introducing at least one gaseous, decomposable compound of silicon into said melt under a pressure of about 0.01 to 30 bar by blowing said at least one gaseous, decomposable compound from below and through said sieve floor and into said melt lying above said sieve floor, said pressure under which said at least one gaseous decomposable compound is introduced into the melt being higher than the sum of the hydrostatic pressure of said melt and the gas pressure above said melt and said gaseous decomposable compound being maintained at a temerature below its decomposition temperature prior to its introduction into said melt said decomposable compound decomposing in said melt and forming liquid silicon;

blowing a cooling gas which is inert with respect to said melt into the space above the melt, in order to prevent silicon from depositing outside the melt; and discharging pure elemental silicon in liquid form from said melt.

2. The process according to claim 1, wherein said gaseous, decomposable compound is trichlorosilane and wherein said compound in admixture with hydrogen is introduced into the melt.

3. The process according to claim 1, characterized in that said silicon melt is kept at a temperature of from 1,420° to 1,470° C.

4. The process according to claim 1 additionally including the steps of discharging the silicon liquid through an overflow pipe and maintaining a predetermined gas pressure above the surface of the melt, so as to regulate the flow of said material through said pipe.

* * * * *